United States Patent [19]

Butterworth

[11] Patent Number: 4,858,075
[45] Date of Patent: * Aug. 15, 1989

[54] RF SHIELDED AND ELECTRICALLY INSULATED CIRCUIT BOARD STRUCTURE AND METHOD OF MAKING SAME

[75] Inventor: Donald J. Butterworth, Glen Mills, Pa.

[73] Assignee: Bell of Pennsylvania, Philadelphia, Pa.

[*] Notice: The portion of the term of this patent subsequent to Sep. 22, 2004 has been disclaimed.

[21] Appl. No.: 8,664

[22] Filed: Jan. 30, 1987

[51] Int. Cl.⁴ .............................................. H05K 1/14
[52] U.S. Cl. ............................... 361/395; 174/DIG. 8
[58] Field of Search ............... 361/395, 419, 380, 397, 361/399; 174/52 PE, DIG. 8

[56] References Cited

U.S. PATENT DOCUMENTS

| | | |
|---|---|---|
| 2,861,911 | 11/1958 | Martin et al. . |
| 3,754,311 | 8/1973 | Rayburn . |
| 3,980,382 | 7/1976 | Reeder . |
| 4,144,438 | 3/1979 | Gelman et al. . |
| 4,370,518 | 1/1983 | Guzy . |
| 4,487,994 | 12/1984 | Bahder . |
| 4,555,422 | 11/1985 | Nakamura et al. . |
| 4,598,165 | 7/1986 | Tsai . |
| 4,695,926 | 9/1987 | McDermott ........................ 361/395 |

Primary Examiner—Roy N. Envall, Jr.
Attorney, Agent, or Firm—Lowe, Price, LeBlanc, Becker & Shur

[57] ABSTRACT

An RF shielded and electrically insulated circuit board structure comprises a first layer of shrink wrap tubing wrapped on a circuit board substrate, and a layer of an electrically conductive RF shielding material on the tubing. A second layer of shrink wrap tubing retains the electrically conductive material to the circuit board. Edge portions of the electrically conductive layer and heat shrink tubing are folded inward to prevent RF energy from the circuit board from leaking from the edges of the structure. The structure is made by wrapping a first heat shrink tubing on the circuit board to insulate and seal any wiring patterns and components thereon and shrinking the tubing by applying heat. The electrically conductive layer is located on the heat shrink tubing, and the second heat shrink tubing is wrapped on the electrically conductive layer and first tubing. Heat is applied to shrink the second tubing, and, with circuit wiring extending outward, the edge portions of the structure are folded inward to complete the structure.

6 Claims, 2 Drawing Sheets

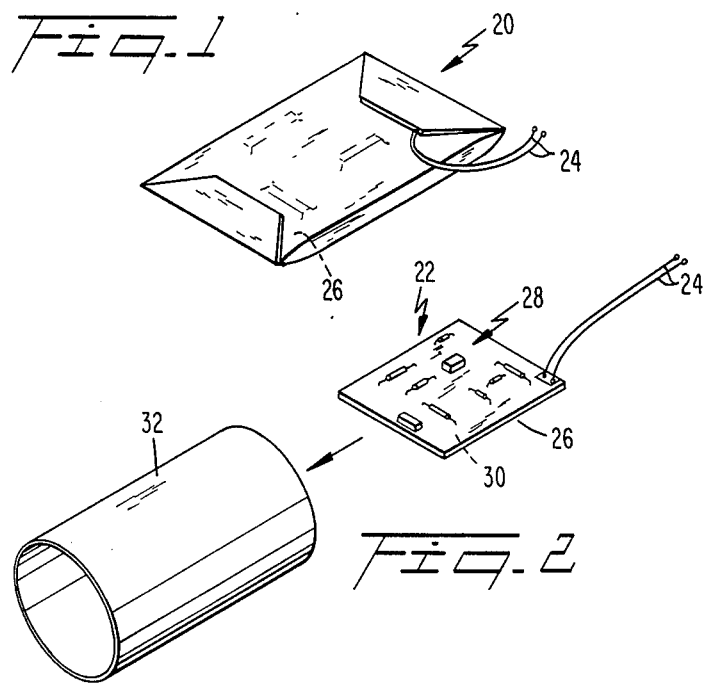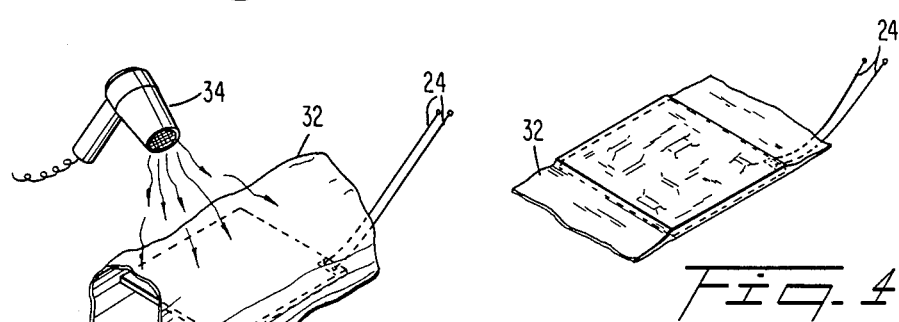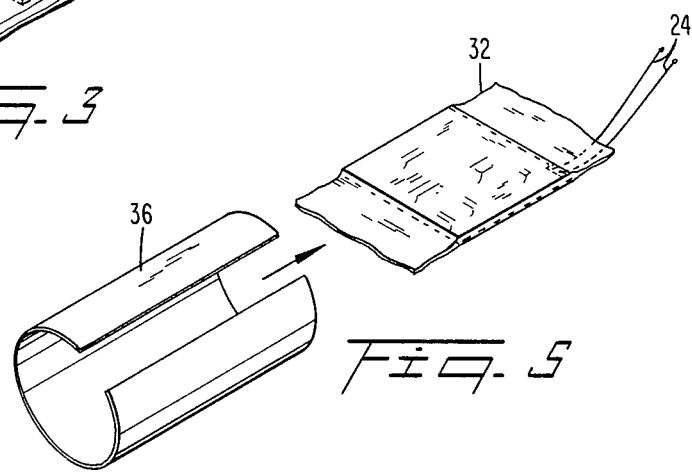

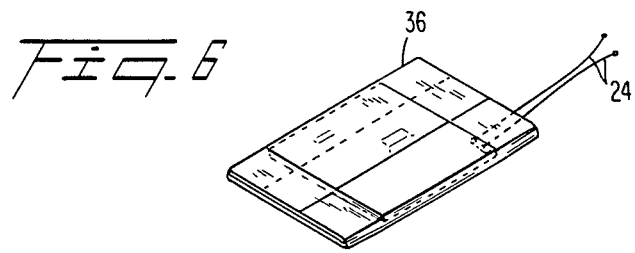
Fig. 6
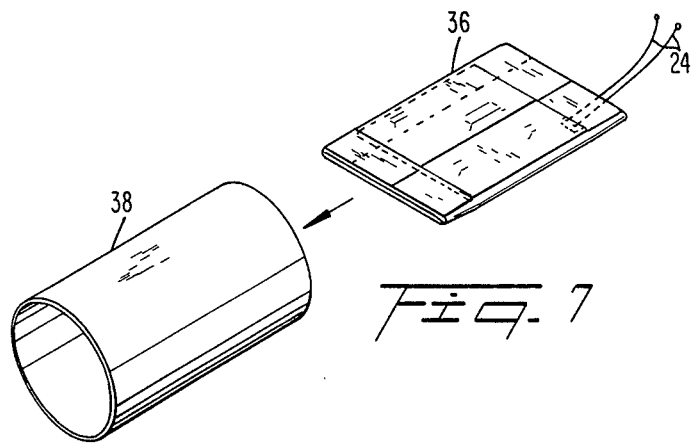
Fig. 7
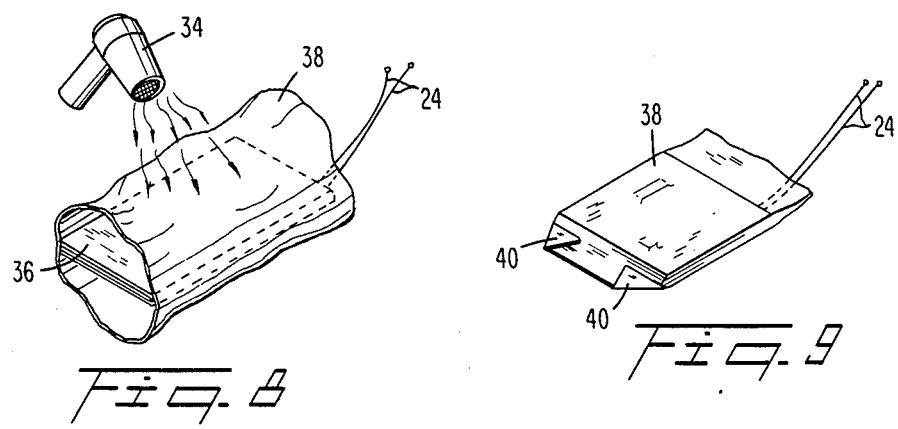
Fig. 8
Fig. 9
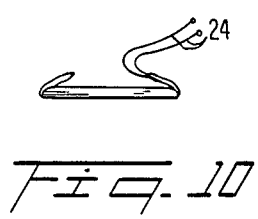
Fig. 10

RF SHIELDED AND ELECTRICALLY INSULATED CIRCUIT BOARD STRUCTURE AND METHOD OF MAKING SAME

CROSS REFERENCE TO RELATED APPLICATIONS

This application is a continuation-in-part of copending application Ser. No. 881,172, filed on July 1, 1986.

TECHNICAL FIELD

The invention relates generally to RF shielding and electrical insulation of circuit boards, and more particularly, to shielding and insulation of printed circuit boards and components using layers of heat shrink tubing and electrically conductive foil.

BACKGROUND ART

Printed circuit boards containing wiring patterns and electronic components mounted thereon are vulnerable to damage or short circuiting as a result of mechanical contact with other circuit boards or objects. It therefore is desirable to encapsulate or insulate the boards, particularly in multiple circuit board environments. Accordingly, copending application Ser. No. 881,172 describes a technique to encapsulate a circuit board by wrapping the board with a shrink wrap tubing, then applying heat to shrink the tubing around the board and any components thereon.

While satisfactory, there still remains a need in some types of circuits that generate radio frequency (RF) energy to electrically shield the circuits and thereby prevent transmission of spurious RF energy therefrom that would tend to cause interference with neighboring equipment. Conversely, it is desirable to shield circuits sensitive to RF interference from RF generated from elsewhere.

An object of the invention, therefore, is to provide an RF shielded and electrically insulated circuit board structure.

Another object is to provide an RF shielded and electrically insulated circuit board structure using heat shrink tubing layers.

A further object of the invention is to provide a method of applying RF shielding and electrical insulation to a printed circuit board having electronic components mounted thereon.

Another object is to provide RF shielding and electrical insulation to a circuit board without adding significantly to the weight or cost of the board.

In accordance with these and other objects of the invention, an RF shielded and electrically insulated electronic circuit board structure comprises a circuit board and a first heat shrink tubing layer wrapping the circuit board and any wiring patterns and components thereon. An electrically conductive layer is located on the first heat shrink tubing layer and second heat shrink tubing layer is wrapped on the conductive layer to retain the conductive layer to the circuit board structure. The two layers of heat shrink tubing are in their shrunk condition to seal the circuit board and retain the electrically conductive shielding layer. Edge portions of the structure may be folded inward to prevent leakage of RF energy from the circuit board out through the edges.

In accordance with another aspect of the invention, the RF shielded and electrically insulated circuit board structure is made by wrapping a circuit board with a first layer of heat shrink tubing and applying heat to shrink the tubing to enclose the board and any wiring patterns and components thereon. An electrically conductive layer for RF shielding is applied on the first heat shrink tubing and the circuit board and electrically conductive layer are wrapped with a second layer of heat shrink tubing. Heat is applied to shrink the second tubing and thereby to retain the electrically conductive layer to the board. With any electrical wiring extending outward from the circuit board, edge portions of the tubing and RF shielding layers are folded inward to seal the edges of the circuit board structure.

Still other objects and advantages of the present invention will become readily apparent to those skilled in this art from the following detailed description, wherein only the preferred embodiment of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 1 is a perspective view of a circuit board structure provided in accordance with the principles of this invention.

FIG. 2 shows a first step of assembly of the structure of FIG. 1, wherein a first heat shrink tube layer is being located on the board.

FIG. 3 shows the application of heat to shrink the first heat shrink tubing on the board.

FIG. 4 is a view of the board structure with the first heat shrink tube layer on the board.

FIG. 5 shows another step of assembly of the circuit board structure, wherein a layer of conductive material for RF shielding is being applied on the first heat shrink tube layer.

FIG. 6 is a view of the circuit board structure with the first heat shrink tubing layer and shielding layers applied.

FIG. 7 shows a further step of assembly of the circuit board structure, wherein a second heat shrink layer is being applied to the board overlying the shielding layer.

FIG. 8 shows the application of heat to shrink the second heat shrink layer on the shielding layer.

FIG. 9 is a view of the nearly completed circuit board structure, with one edge portion being folded inward to provide a seal.

FIG. 10 is a side view of the completed circuit board structure.

BEST MODE FOR PRACTICING THE INVENTION

Referring to FIG. 1, a circuit board structure 20, RF shielded and electrically insulated in accordance with the invention, comprises a standard printed circuit board substrate 26 wrapped by layers of heat shrink tubing and metal foil to form the composite structure shown. The circuit board structure, with electrical conductors 24 extending therefrom, is compact, and adds very little to the weight and cost of the circuit board.

The structure 20 is comprised of a standard printed circuit board wrapped by two layers of heat shrink tubing sandwiching a layer of metal foil that functions as an RF shield. Manufacture of the structure 20, in accordance with the invention, is described below with reference to FIGS. 2-10.

In FIG. 2, the circuit board 26 is noted to be a conventional printed circuit board substrate having a number of electronic components 28 on one side of the board and printed wiring patterns 30 on the opposite side. The circuit board could alternatively be a double sided printed circuit board having printed wiring patterns on both side and could also have electronic components mounted on both sides of the board. Electric wires or conductors 24 extend outward from the board 22 to be connected to external circuitry or power.

The printed circuit board 22 is positioned within a layer of conventional heat shrink tubing 3 until the tubing layer completely wraps the board, as shown in FIG. 2. Heat from an external source of heat, such as a heat gun 24 (FIG. 3), is applied to the tubing layer 32 to shrink the tubing until it forms a wrap, as shown in FIG. 4, with the wires 24 extending outward from the board and overlying layer. The heat supplied by the source 34 should be sufficient to shrink the tubing 32 but not so substantial as to damage components 28 or the printed wiring pattern 30 on the board 22.

With reference to FIG. 5, a layer of metal foil 36 is now applied on the tubing layer 32 and board 22 to function as an RF shield. The foil layer 36 is preferably grounded or connected to a reference potential source to cause externally generated stray RF fields to bypass circuitry on board 22 and, conversely, to conduct to ground or to the reference potential source any RF energy generated by the circuitry. The foil layer 36 is next flattened to conform to the shape of the underlying tubing and board, as shown in FIG. 6.

The board 22, together with tubing 32 and foil 36, is located within a second layer of heat shrink tubing 38, as shown in FIG. 7, and heat is applied by source 34 to the tubing 38 (FIG. 8) to shrink it to conform to the shape of the board and underlying layers. As the tubing layer 38 shrinks, it retains the foil 36 to the outer surface of tubing layer 3 beneath.

Finally, edge portions 40, shown in FIG. 9),are folded inward as shown to seal the edge of the structure. The opposite edge portions are also folded similarly (not shown) to form the resultant structure shown in side view in FIG. 10, with the wires 24 of circuit board 22 extending outward therefrom to be connected to external circuitry.

There has accordingly been described a novel printed circuit board structure that shield a printed circuit board and electronic components thereon from RF energy and electrically insulates the board as well. The structure, formed by a metal foil layer sandwiched between heat shrink tubing layers on a printed circuit board, does not appreciably add to the size, weight or cost of the circuit, and is easily fabricated.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. An RF shielded and electrically insulated electronic circuit board structure, comprising:
    a circuit board for mounting electronic components thereon;
    a first heat shrink tubing layer wrapping the circuit board and any wiring patterns and any components thereon;
    an electrically conductive layer on said first heat shrink tubing layer; and
    a second heat shrink tubing layer wrapping the conductive layer to retain said conductive layer to said board structure.

2. The structure of claim 1, wherein said electrically conductive layer is a metallic foil.

3. The structure of claim 1, wherein edge portions of said structure are folded inward to prevent leakage therethrough of RF energy from said circuit board.

4. The structure of claim 1, including means for electrically grounding said conductive layer.

5. A method of making an RF shielded and electrically insulated circuit board structure, comprising the steps of:
    wrapping a circuit board with a first heat shrink tubing and heating said tubing to shrink said tubing to enclose said board and any wiring patterns and components thereon;
    applying an electrically conductive layer on said first heat shrink tubing; and
    wrapping said circuit board and electrically conductive layer with a second heat shrink tubing and heating said second heating shrink tubing to shrink said second tubing and thereby to retain said electrically conductive layer to said board.

6. The method of claim 5, including the additional step of folding edge portions of said structure inward to prevent leakage therethrough of RF energy from said circuit board.

* * * * *